United States Patent
Nam (10) Patent No.: US 8,940,632 B2
(45) Date of Patent: Jan. 27, 2015

(54) SEMICONDUCTOR DEVICES AND METHOD OF FABRICATING THE SAME

(71) Applicant: Samsung Electronics Co., Ltd., Suwon-si (KR)

(72) Inventor: Sangdon Nam, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/134,573

(22) Filed: Dec. 19, 2013

(65) Prior Publication Data

US 2014/0342551 A1 Nov. 20, 2014

(30) Foreign Application Priority Data

May 20, 2013 (KR) ........................ 10-2013-0056640

(51) Int. Cl.
*H01L 21/4763* (2006.01)
*H01L 21/768* (2006.01)

(52) U.S. Cl.
CPC .... *H01L 21/76843* (2013.01); *H01L 21/76814* (2013.01); *H01L 21/7682* (2013.01); *H01L 21/76831* (2013.01); *H01L 21/76877* (2013.01)
USPC ............................ 438/619; 438/622; 438/653

(58) Field of Classification Search
USPC ............................ 438/618, 619, 622, 627, 653
See application file for complete search history.

(56) References Cited

U.S. PATENT DOCUMENTS

| | | | |
|---|---|---|---|
| 6,057,224 A * | 5/2000 | Bothra et al. ................ | 438/619 |
| 6,307,265 B1 | 10/2001 | Anand et al. | |
| 6,642,138 B2 * | 11/2003 | Pan et al. ...................... | 438/619 |
| 6,815,329 B2 | 11/2004 | Babich et al. | |
| 7,037,851 B2 | 5/2006 | Gueneau de Mussy et al. | |
| 8,120,179 B2 | 2/2012 | Chanda et al. | |
| 2006/0057835 A1 * | 3/2006 | Anderson et al. ............. | 438/619 |
| 2006/0281295 A1 * | 12/2006 | Naujok et al. ................ | 438/618 |
| 2007/0035816 A1 | 2/2007 | Daamen et al. | |
| 2007/0120263 A1 | 5/2007 | Gabric et al. | |
| 2009/0093100 A1 | 4/2009 | Xia et al. | |
| 2009/0280638 A1 * | 11/2009 | Zenasni ........................ | 438/619 |

FOREIGN PATENT DOCUMENTS

| | | |
|---|---|---|
| JP | 2008066498 | 3/2008 |
| JP | 2010141024 | 6/2010 |
| JP | 2011165876 | 8/2011 |

OTHER PUBLICATIONS

R. Daamen et al., Multi-Level Air Gap Integration for 32/22nm nodes using a Spin-on Thermal Degradable Polymer and a SiOC CVD Hard Mask, 2007 IEEE.

* cited by examiner

*Primary Examiner* — Kevin M Picardat
(74) *Attorney, Agent, or Firm* — Onello & Mello, LLP (57) ABSTRACT

In a method of fabricating a semiconductor device, a first sacrificial layer, a first insulating layer, and a second sacrificial layer are successively provided on a substrate. The second sacrificial layer, the first insulating layer, and the first sacrificial layer are patterned to define an opening exposing a portion of the substrate and successively forming second sacrificial patterns, capping patterns, and first sacrificial patterns on the substrate. A second insulating layer is conformally formed at inner sidewalls and a bottom of the opening. The second insulating layer and the second sacrificial patterns are etched to form spacers on sidewalls of the first sacrificial patterns and to remove the second sacrificial patterns. A wiring pattern is provided to fill the opening in which the spacers are formed. The first sacrificial patterns are then vaporized.

17 Claims, 11 Drawing Sheets

SEMICONDUCTOR DEVICES AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-056640, filed on May 20, 2013, the entire contents of which are hereby incorporated by reference.

BACKGROUND

Embodiments of the present inventive concepts relate to semiconductor devices and methods of fabricating the same, and more particularly, to semiconductor devices including wiring structures and methods of fabricating the same.

Semiconductor devices are central to the electronics industry due to amenability to certain features such as miniaturization, multifunction, and low fabricating costs. Semiconductor devices can be generally classified into semiconductor memory devices adapted for large-scale storage of data, semiconductor logic devices adapted for calculating and processing logic data, and hybrid semiconductor devices which include both memory devices and logic devices.

Along with the current trend toward high speed and low power consumption in electronic equipment, the demand for high-speed operation and/or low operation voltage in semiconductor devices accompanied therein continues to increase. To satisfy the above-described demand, semiconductor devices continue to become more highly integrated. Along with increased integration, device reliability is of ever-increasing concern.

SUMMARY

The present disclosure relates to a semiconductor device having high reliability to optimize high integrity.

The present disclosure also relates to a method of fabricating a semiconductor device having high reliability to optimize high integrity.

In an aspect, a method of fabricating a semiconductor device comprises; successively providing a first sacrificial layer, a first insulating layer, and a second sacrificial layer on a substrate; patterning the second sacrificial layer, the first insulating layer, and the first sacrificial layer to define an opening exposing a portion of the substrate and successively forming second sacrificial patterns, capping patterns, and first sacrificial patterns on the substrate; conformally forming a second insulating layer at inner sidewalls and a bottom of the opening; etching the second insulating layer and the second sacrificial patterns to form spacers on sidewalls of the first sacrificial patterns and to remove the second sacrificial patterns; forming a wiring pattern to fill the opening in which the spacers are formed; vaporizing the first sacrificial patterns.

In some embodiments, the first sacrificial layer comprises a hydrocarbon-based material.

In some embodiments, the first insulating layer comprises a porous material.

In some embodiments, the second sacrificial layer and the second insulating layer comprise the same material.

In some embodiments, the second sacrificial layer and the second insulating layer each comprise silicon carbon nitride.

In some embodiments, the vaporizing of the first sacrificial patterns comprises vaporizing using heat energy or optical energy.

In some embodiments, the forming of the wiring pattern comprises: forming a wiring layer to further cover the opening in which the spacers are formed; and planarizing the wiring layer until the capping patterns are exposed.

In some embodiments, the wiring layer comprises tungsten or copper.

In some embodiments, the method further comprises forming a barrier layer along the inner sidewalls and the bottom of the opening in which the spacers are formed prior to forming the wiring layer.

In some embodiments, the wiring layer comprises tungsten, and the barrier layer comprises a metal barrier layer.

In some embodiments, the metal barrier layer comprises at least one selected from tantalum (Ta), tantalum nitride (TaN), ruthenium (Ru), cobalt (Co), manganese (Mn), titanium (Ti), titanium nitride (TiN), tungsten nitride (WN), nickel (Ni), nickel boride (NiB), and combinations thereof.

In some embodiments, the wiring layer comprises copper, and the barrier layer comprises a dual layer in turn comprising a metal barrier layer and a seed layer on the metal barrier layer.

In an aspect, a semiconductor device comprises; wires on a substrate; and an interlayer insulating structure between the wires, wherein the interlayer insulating structure comprises: pacers at sidewalls of the wires; and a capping pattern between upper portions of the spacers, wherein the spacers and the capping pattern comprise materials that are different from each other, and wherein the substrate, the spacers, and the capping pattern encompass an air gap.

In some embodiments, the capping pattern comprises pores.

In some embodiments, the semiconductor device further comprises an etch stop layer on the substrate in a lower portion of the air gap.

In an aspect, a method of fabricating a semiconductor device comprises: successively providing a first sacrificial layer, a first insulating layer, and a second sacrificial layer on a substrate; patterning the second sacrificial layer, the first insulating layer, and the first sacrificial layer to define openings exposing a portion of the substrate and thereby forming second sacrificial patterns, capping patterns, and first sacrificial patterns on the substrate between neighboring ones of the openings; conformally forming a second insulating layer at inner sidewalls and a bottoms of the openings; etching the second insulating layer and the second sacrificial patterns to form spacers on sidewalls of the first sacrificial patterns in the openings; providing a conductive material in the openings; and vaporizing the first sacrificial patterns to form air gaps between the neighboring ones of the openings.

In some embodiments, vaporizing the first sacrificial patterns comprises forming the air gaps between the spacers in a horizontal direction of the substrate and between the substrate and the first insulating layer in a vertical direction of the substrate.

In some embodiments, the method further comprises: providing an etch stop layer on the substrate prior to providing the first insulating layer; wherein forming the air gaps further comprises forming the air gaps between the etch stop layer and the first insulating layer in the vertical direction of the substrate.

In some embodiments, providing the first insulating material comprises providing a porous material.

In some embodiments, vaporizing the first sacrificial patterns comprises vaporizing the first sacrificial patterns through pores in the porous material.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION OF EMBODIMENTS

Exemplary embodiments of the inventive concepts will be described below in more detail with reference to the accompanying drawings. Advantages and features of the inventive concepts, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the inventive concepts to those skilled in the art. Further, the present inventive concepts are only defined by the claim scope of the various claims. In the drawings, the dimensions of layers and regions are exaggerated for clarity of illustration.

In the following description, the various technical terms are used only for explain a specific exemplary embodiment while not limiting the inventive concepts. The terms of a singular form may include plural forms unless referred to the contrary. The terms "include," "comprise," "including," and "comprising," as used herein, specify a component, a process, an operation, and/or an element but do not exclude other components, processes, operations, and/or elements. Since embodiments are provided in detail below, the order of the reference numerals given in the description is not limited thereto. It will be understood that when an element such as a layer, film, region, or substrate is referred to as being "on" another element, it can be directly on the other element or intervening elements may also be present.

Additionally, the embodiment in the detailed description will be described with sectional views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. For example, an etched region illustrated or described as a rectangle will, typically, have be rounded or a predetermined curvature. Thus, the regions illustrated in the figures are schematic in nature and their shapes are not intended to illustrate the precise shape of a region of a device and are not intended to limit the scope of the inventive concepts.

Figure 1:
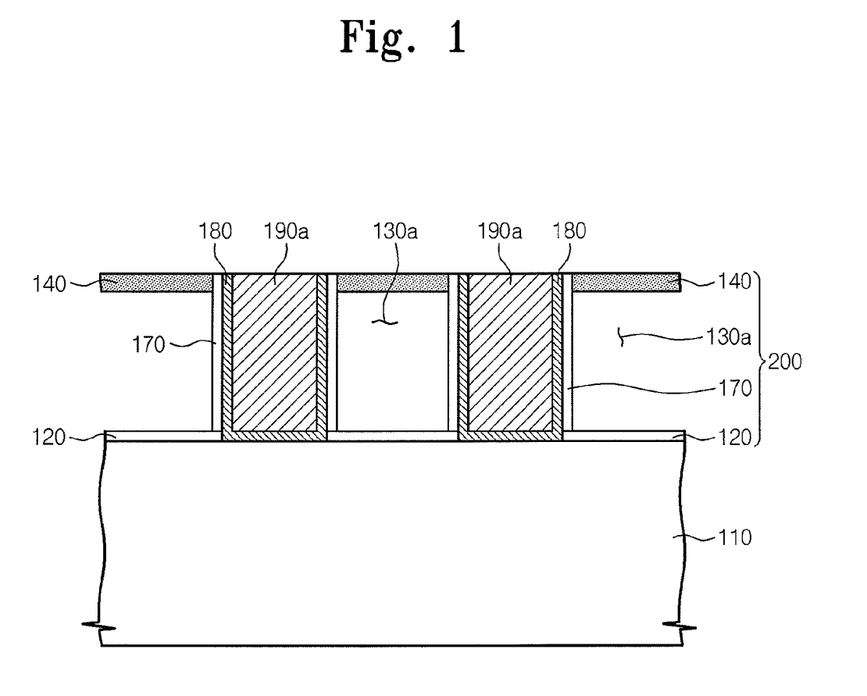
FIG. 1 is a cross-sectional view of a semiconductor device according to an embodiment of the inventive concepts.

FIG. 1 is a cross-sectional view of a semiconductor device according to an embodiment of the inventive concepts.

Referring to FIG. 1, a semiconductor device may include a substrate 110, an etch stop layer 120, an air gap 130a, a capping pattern 140, spacers 170, and wiring patterns 190a.

The substrate 110 may comprise a semiconductor substrate, for example, a silicon (Si) substrate, a germanium (Ge) substrate, a silicon-germanium (SiGe) substrate, or other suitable substrate material. An integrated circuit including transistors and/or memory cells may be provided in or on the substrate 110.

An interlayer insulating structure 200 may be provided to include the etch stop layer 120, the capping pattern 140, the spacers 170, and the air gap 130a defined by the etch stop layer 120, the capping pattern 140, and the spacers 170. The air gap 130a may comprise a region in which liquid and/or solid material(s) are/is not provided. That is, the air gap 130 may comprise a substantially empty space or void region.

In some embodiments, the etch stop layer 120 may be disposed between the substrate 110 and the air gap 130a and between the substrate 110 and the spacers 170. In some embodiments, the etch stop layer 120 may include a material having an etch selectivity with respect to the capping pattern 140. In some embodiments, the etch stop layer 120 may include a low-k material. In some embodiments, the etch stop layer 120 according to an embodiment of the inventive concept may include silicon carbon nitride (SiCN). The etch stop layer 120 may operate to reduce dispersion in etching degree with respect to the substrate during the process of forming the wiring patterns 190a.

In some embodiments, the capping pattern 140 may be disposed between upper portions of the spacers 170. In some embodiments, the capping pattern 140 may include a SiOC-based material. In some embodiments, the capping pattern 140 according to an embodiment of the inventive concept may include p-SiOCH. In some embodiments, the capping pattern 140 may include pores through which materials generated by evaporation of a sacrificial material can be discharged in a process of forming the interlayer insulating structure 200.

In some embodiments, the spacers 170 may be disposed on sidewalls of the wiring patterns 190a. In some embodiments, the etch stop layer 120 may include the low-k material. In some embodiments, each of the spacers 170 according to embodiments of the inventive concepts may include silicon carbon nitride (SiCN). In this manner, the etch stop layer 120, the capping pattern 140, and the spacers 170 may define the air gap 130a of the interlayer insulating structure 200.

In some embodiments, the wiring pattern 190a may include a conductive material such as tungsten (W) or copper (Cu). The wiring pattern 190a may be electrically connected to the transistors and/or the memory cells which are disposed within the substrate 110. In some embodiments, a barrier layer 180 may be disposed between the substrate 110 and the wiring pattern 190a and between the interlayer insulating structure 200 and the wiring pattern 190a. That is, the barrier layer 180 may be disposed between the substrate 110 and the wiring pattern 190a, between the etch stop layer 120 and the wiring pattern 190a, and between the spacers 170 and the wiring pattern 190a. The barrier layer 180 may operate to prevent a metal component of the wiring pattern 190a from being diffused into the substrate 110 and/or the interlayer insulating structure 200 during or following formation of the wiring patterns 190a.

When the wiring pattern 190a includes tungsten (W), the barrier layer 180 may comprise a metal barrier layer. In some embodiments, the metal barrier layer may include at least one selected from tantalum (Ta), tantalum nitride (TaN), ruthenium (Ru), cobalt (Co), manganese (Mn), titanium (Ti), titanium nitride (TiN), tungsten nitride (WN), nickel (Ni), nickel boride (NiB), and combinations thereof.

When the wiring pattern 190a includes copper, the barrier layer 180 may be a dual layer constituted by the metal barrier layer and a seed layer disposed on the metal barrier layer. The seed layer may include copper.

Although not shown, a wiring structure similar to the interlayer insulating structure 200 and the wiring pattern 190a may be additionally disposed on the substrate 110 including the wiring pattern 190a.

Semiconductor devices according to embodiments of the inventive concept may include the interlayer insulating structure including the air gap defined by the substrate, the spacers respectively disposed on sidewalls of each of wires, and the capping patterns disposed between upper portions of the spacers. Owing to this structure of the interlayer insulating structure, it is possible to prevent the wire from collapsing. Accordingly, semiconductor devices having high reliability may be provided.

Also, semiconductor devices according to embodiments of the inventive concepts may include the interlayer insulating structure including the air gap defined by the substrate, the spacers respectively disposed on both sidewalls of each of wires, and the capping pattern disposed between upper portions of the spacers. Owing to this structure of the interlayer insulating structure, it is possible to reduce problems associated with RC delay. Accordingly, semiconductor devices optimized for high integrity may be provided.

FIGS. 2 to 8 are cross-sectional views for explaining a method of fabricating a semiconductor device according to embodiments of the inventive concept.

Figure 2:
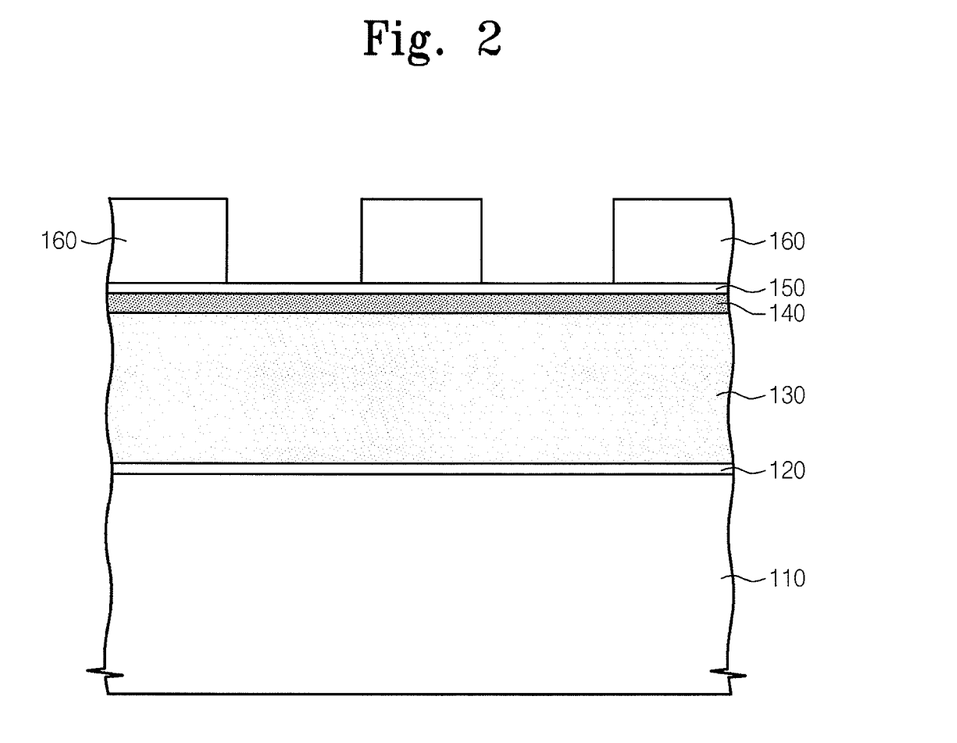
FIGS. 2 to 8 are cross-sectional views for explaining a method of fabricating a semiconductor device according to embodiments of the inventive concepts.

Referring to FIG. 2, an etch stop layer 120, a first sacrificial layer 130, a first insulating layer 140, and a second sacrificial layer 150 are successively formed on a substrate 110. In some embodiments, the etch stop layer 120, the first sacrificial layer 130, the first insulating layer 140, and the second sacrificial layer 150 may be formed using a chemical vapor deposition (CVD) method. In some embodiments, a mask pattern 160 is formed on a predetermined area of the second sacrificial layer 150. In some embodiments, the mask pattern 160 may include photoresist.

The substrate 110 may comprise a semiconductor substrate, for example, a silicon (Si) substrate, a germanium (Ge) substrate, or a silicon-germanium (SiGe) substrate. An integrated circuit including transistors and/or memory cells may be provided within the substrate 110.

In some embodiments, the etch stop layer 120 may include a material having etch selectivity with respect to the first insulating layer 140. In some embodiments, the etch stop layer 120 may include a low-k material. In some embodiments, the etch stop layer 120 may include silicon carbon nitride (SiCN). The etch stop layer 120 may operate to reduce dispersion in the amount of etching of the substrate during the process of forming wiring patterns (see reference numeral 190a of FIG. 1).

In some embodiments, the first sacrificial layer 130 may comprise a material that is amenable to being vaporized by a process that utilizes heat energy or optical energy. In some embodiments, the first sacrificial layer 130 may comprise a hydrocarbon ($C_xH_y$; x+y=1)-based material. In some embodiments, the first sacrificial layer 130 may be vaporized in a post process for forming an air gap (see reference numeral 130a of FIG. 1), after formation of the wiring patterns 190.

In some embodiments, the first insulating layer 140 may be formed of a SiOC-based material. In some embodiments, the first insulating layer 140 may include p-SiOCH. In some embodiments, the first insulating layer 140 may include pores through which materials generated by evaporation of a sacrificial material can be discharged in the process of forming the air gap 130a.

In some embodiments, the second sacrificial layer 150 may be formed of a low-k material. That is, the second sacrificial layer 150 may be formed of the same material as the etch stop layer 120. In some embodiments, the second sacrificial layer 150 may include silicon carbon nitride (SiCN).

Figure 3:
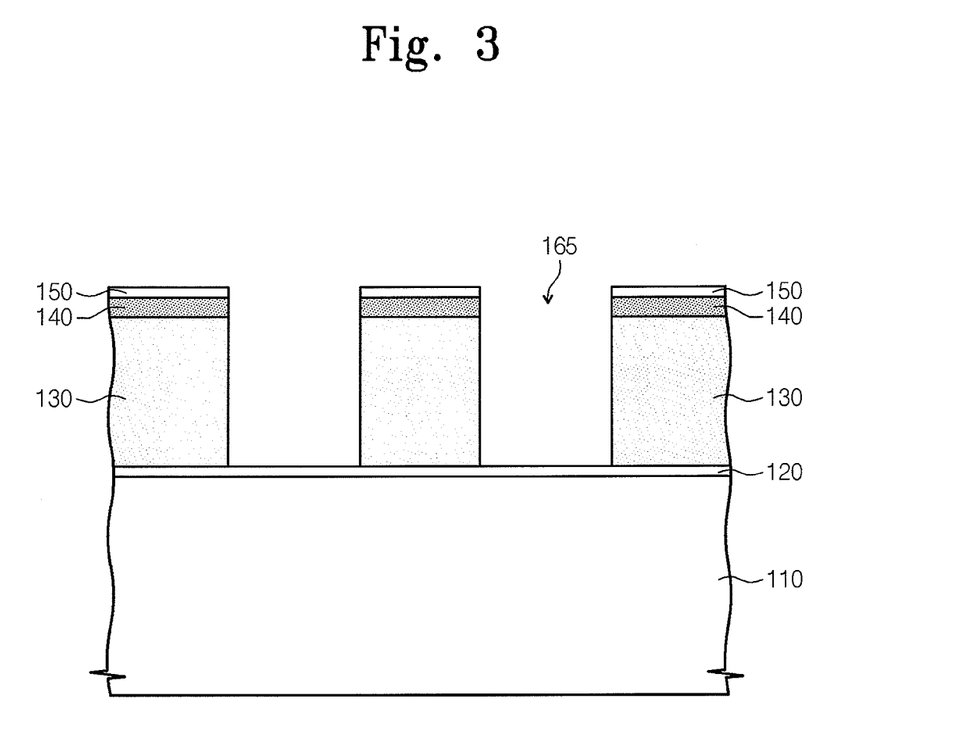

Referring to FIG. 3, an opening 165 passing through the second sacrificial layer 150, the first insulating layer 140, and the first sacrificial layer 130 to expose a portion of the etch stop layer 120 is formed. As the opening is formed, the second sacrificial layer 150, the first insulating layer 140, and the first sacrificial layer 130 are successively etched by an etching process using a mask pattern 160 as a mask to expose a portion of the etch stop layer 120. That is, a portion of the etch stop layer 120 may be exposed by a first sacrificial pattern 130, a capping pattern 140, and a second sacrificial pattern 150 which are successively stacked on the etch stop layer 120. In some embodiments, the etching process may use an anisotropic etch method. After the etching process is performed, the mask pattern 160 can be removed.

Figure 4:
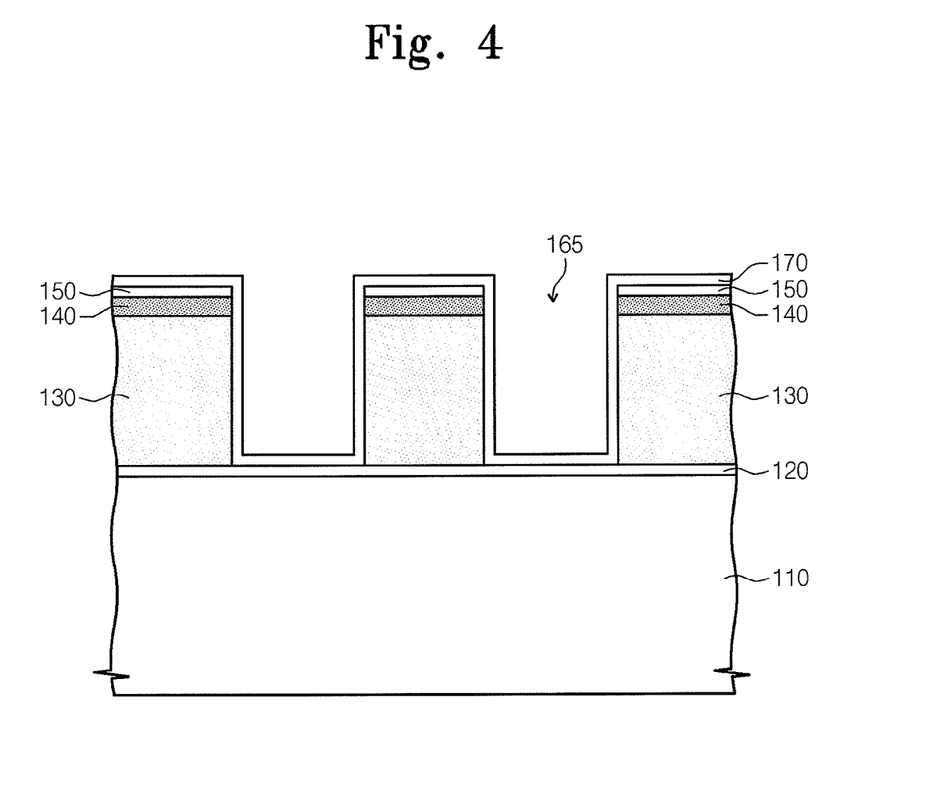

Referring to FIG. 4, a second insulating layer 170 is provided along a profile of the substrate 110 having the opening 165. In some embodiments, the second insulating layer 170 may be formed of the same material as the second sacrificial pattern 150. That is, in some embodiments, the second insulating layer 170 may include silicon carbon nitride (SiCN).

Figure 5:
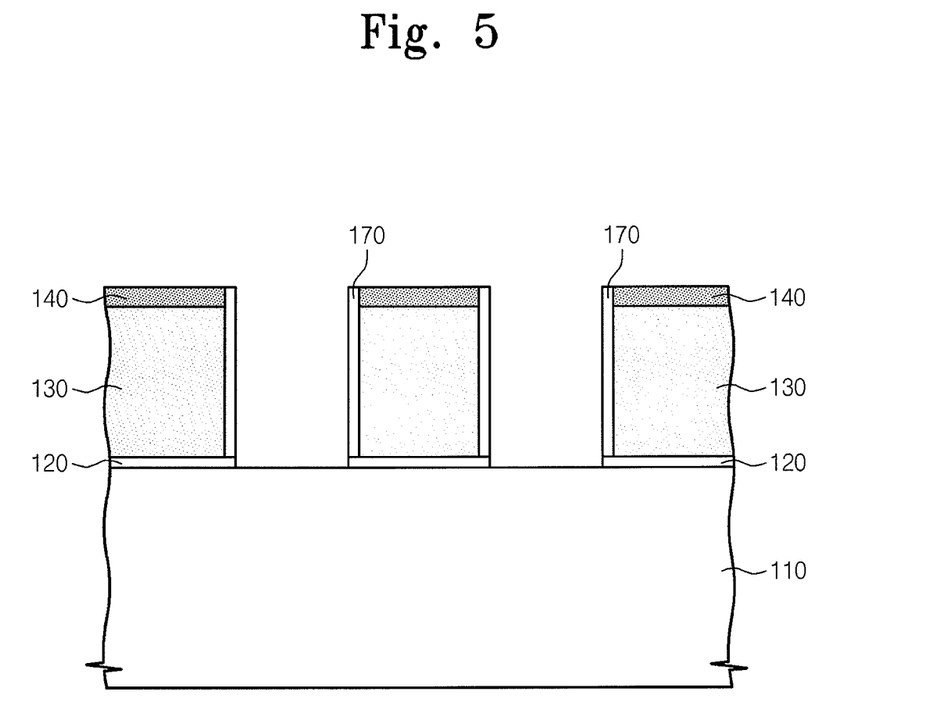

Referring to FIG. 5, in some embodiments, as the second insulating layer 170 and the second sacrificial pattern 150 are etched, spacers 170 may be formed on both sidewalls of the first sacrificial pattern 130, and simultaneously, the second sacrificial pattern 150 may be removed. Also, the portion of the etch stop layer 120 exposed by the opening 165 may be removed.

In some embodiments, the second insulating layer 170 and the second sacrificial pattern 150 may be etched by using an anisotropic dry etch method. Here, in some embodiments, since the second insulating layer 170, the second sacrificial pattern 150, and the etch stop layer 120 are formed as the same material, portions of the second sacrificial pattern 150 and the second insulating layer 170 which are formed on the capping pattern 140 and the etch stop layer 120 and the second insulating layer 170 which are formed in a lower portion of the opening 165 may be removed at the same time by the etching process. Thus, the spacers 170 may be formed on sidewalls of each of the first sacrificial pattern 130 and the capping pattern 140.

Figure 6:
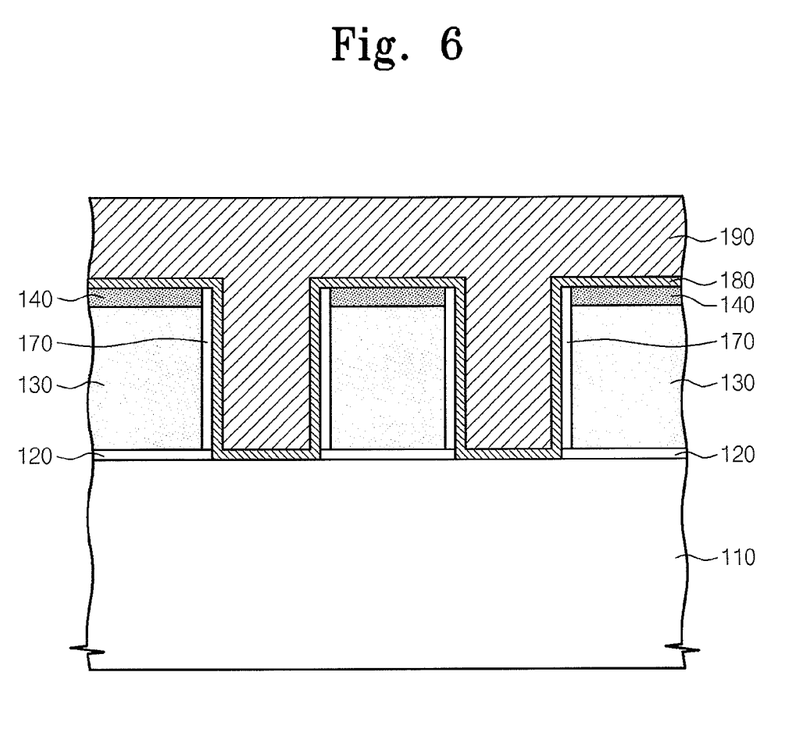

Referring to FIG. 6, a barrier layer 180 is provided along a profile of the substrate 110 having the opening 165 in which the spacers 170 are formed. In some embodiments, the barrier layer 180 may comprise a metal barrier layer. In some embodiments, the metal barrier layer may include at least one selected from tantalum (Ta), tantalum nitride (TaN), ruthenium (Ru), cobalt (Co), manganese (Mn), titanium (Ti), titanium nitride (TiN), tungsten nitride (WN), nickel (Ni), nickel boride (NiB), and combinations thereof. Also, in some embodiments, the barrier layer 180 may comprise a dual layer including the metal barrier layer and a seed layer formed on the metal barrier layer. In some embodiments, the seed layer may include copper.

A wiring layer 190 covering the substrate 110 on which the barrier layer 180 is formed may be formed. In some embodiments, the wiring layer 190 may be formed of tungsten or copper. The barrier layer 180 may operate to prevent a metal component of the wiring layer 190 from being diffused into the substrate 110, the etch stop layer 120, and/or the capping pattern 140.

In some embodiments, when the wiring layer 190 is formed of tungsten, the barrier layer 180 may comprise a metal barrier layer. In some embodiments, the metal barrier layer may include at least one selected from tantalum (Ta), tantalum nitride (TaN), ruthenium (Ru), cobalt (Co), manganese (Mn), titanium (Ti), titanium nitride (TiN), tungsten nitride (WN), nickel (Ni), nickel boride (NiB), and combinations thereof. In some embodiments, when the wiring layer 190 is formed of tungsten, the barrier layer 190 may be formed by using a physical vapor deposition (PVD) method or a CVD method.

When the wiring layer 190 is formed of copper, the barrier layer 180 may comprise a dual layer including the metal barrier layer and a seed layer formed on the metal barrier layer. When the wiring layer 190 is formed of copper, the barrier layer 190 may be formed, for example, by an electroplating method.

Figure 7:
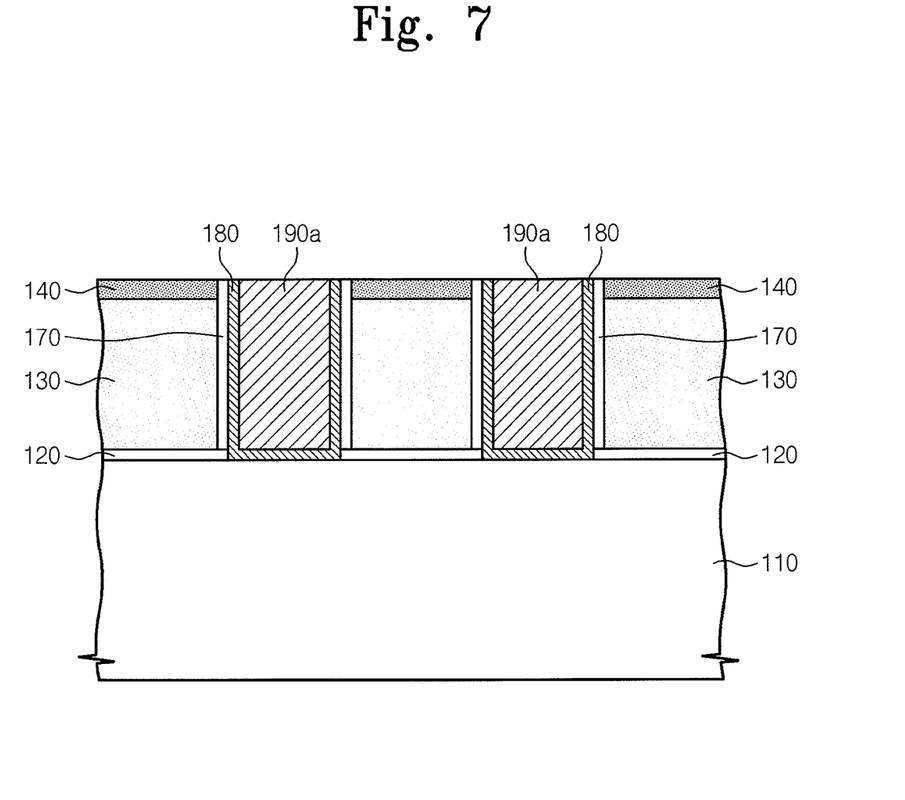

Referring to FIG. 7, the wiring layer 190 may be planarized until the capping pattern 140 is exposed. In some embodiments, the wiring layer 190 may be planarized by using a chemical mechanical polishing (CMP) method. Thus, a wiring pattern 190a is formed having a top surface that is exposed. The wiring pattern 190a may be electrically connected to the transistors and/or the memory cells which are disposed within the substrate 110.

Figure 8:
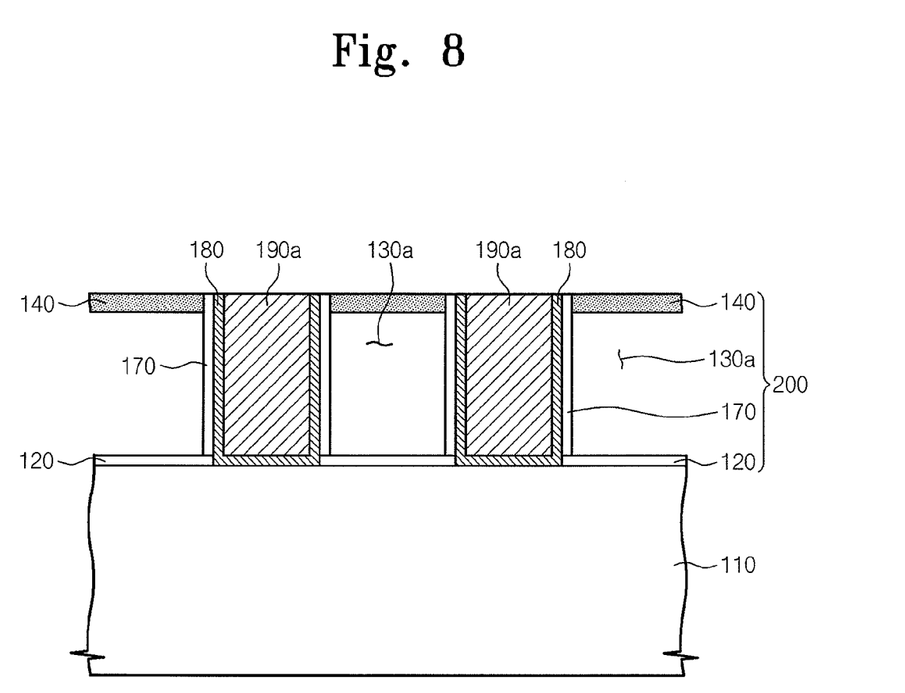

Referring to FIG. 8, as the first sacrificial pattern 130 is evaporated, an air gap 130a or void, is formed. The air gap 130 can be defined by the spacers 170 positioned at sidewalls of each of the wiring patterns 190a, the capping pattern 140 positioned between upper portions of the spacers 170, and the etch stop layer 120 positioned on the substrate 110 may be formed.

The process of vaporizing the first sacrificial pattern 130 may include, for example, a process of applying a temperature of about 400° C. or more or a process of applying ultraviolet (UV) rays. In the process of vaporizing the first sacrificial pattern 130, UV rays may be irradiated onto the first sacrificial pattern 130 at a temperature of about 400° C. or more. Thus, the carbon-based material may receive energy and then be evaporated, and then the evaporated carbon-based material may be discharged through the pores of the capping pattern 140.

As a result, the semiconductor device may include an interlayer insulating structure 200 including the etch stop layer 120, the capping pattern 140, the spacers 170, and the air gap 130a, which is defined by the etch stop layer 120, the capping pattern 140, and the spacers 170, between the wiring patterns 190a.

Although not shown, a wiring structure similar to the interlayer insulating structure 200 and the wiring pattern 190a may be additionally formed on the substrate 110 including the wiring pattern 190a.

Semiconductor devices fabricated using the method according to an embodiment of the inventive concept may include an interlayer insulating structure, the interlayer insulating structure comprising the air gap defined by the substrate, the spacers respectively disposed on both sidewalls of each of wires, and the capping pattern disposed between upper portions of the spacers. In view of such an interlayer insulating structure, it is possible to prevent the wires from collapsing. Accordingly, a method of fabricating semiconductor devices having high reliability may be provided.

In addition, semiconductor devices fabricated according to the method according to embodiments of the inventive concepts may include the interlayer insulating structure including the air gap defined by the substrate, spacers respectively disposed on sidewalls of each of wires, and the capping pattern disposed between upper portions of the spacers. Owing to this structure of the interlayer insulating structure, it is possible to reduce problems associated with RC delay. Accordingly, a method of fabricating semiconductor devices optimized for high integrity may be provided.

Figure 9:
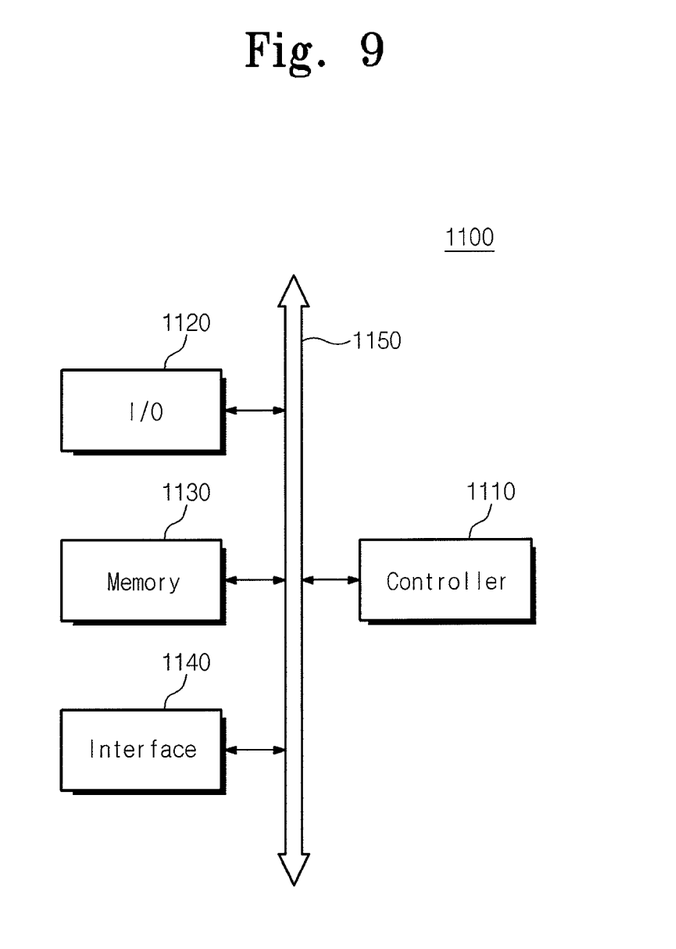
FIG. 9 is a schematic block diagram illustrating an example of a memory system including the semiconductor device according to the embodiments of the inventive concepts.

FIG. 9 is a schematic block diagram illustrating an example of a memory system including a semiconductor device according to embodiments of the inventive concepts.

Referring to FIG. 9, a memory system 1100 may be applied to, for example, a personal digital assistant (PDA), a portable computer, a web tablet, a wireless phone, a mobile phone, a digital music player, a memory card or all devices which may transmit and/or receive data in a wireless environment.

The memory system 1100 includes a controller 1110, an input/output (I/O) device 1120 such as a key pad, a key board, and a display, a memory 1130, an interface 1140 and a bus 1150. The memory 1130 and the interface 1140 communicate with each other through the bus 1150.

The controller 1110 includes a microprocessor, a digital signal processor, a microcontroller or other process devices similar to the microprocessor, the digital signal processor and the microcontroller. The memory 1130 may be used to store commands executed by the controller 1110. The I/O device 1120 may receive data from the outside of the memory system 1100 or transmit data to the outside of the memory system 1100. For example, the I/O device 1120 may include a key board, a key pad or a display.

The memory 1130 includes the semiconductor device according to the embodiments of the inventive concept. The memory 1130 may further include a different categories of memory, for example, a volatile memory which can randomly access data and various other kinds of memories.

The interface 1140 transmits data to a communication network or receives data from a communication network.

Figure 10:
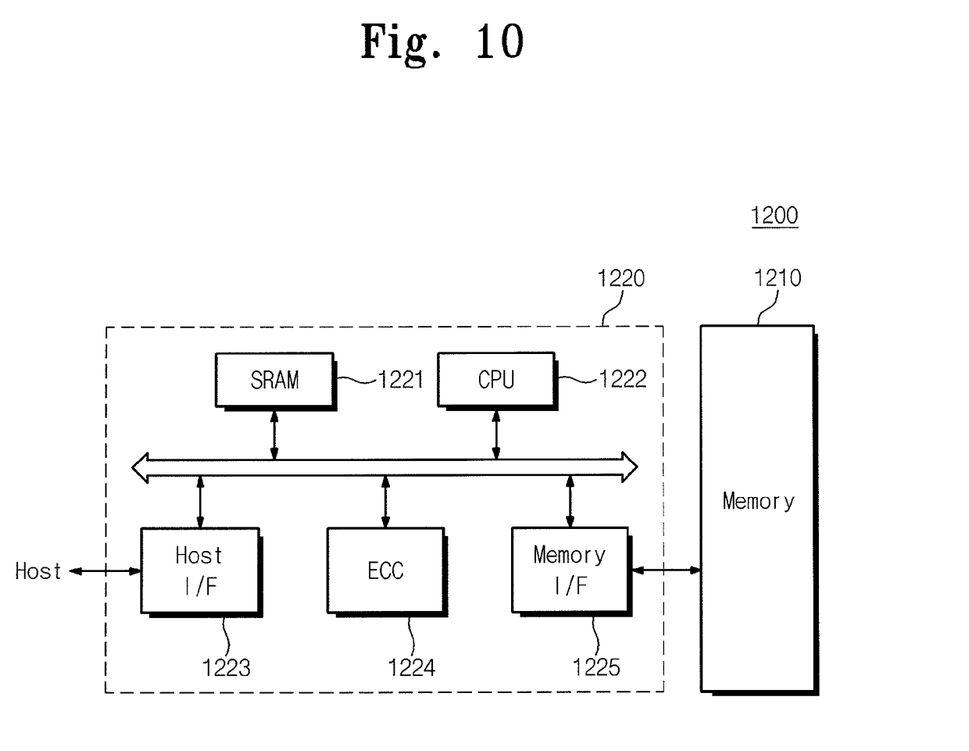
FIG. 10 is a schematic block diagram illustrating an example of a memory card including the semiconductor device according to the embodiments of the inventive concepts.

FIG. 10 is a schematic block diagram illustrating an example of a memory card including the semiconductor device according to the embodiments of the inventive concept.

Referring to FIG. 10, a memory card 1200 for supporting a storage capability of large amounts of data is fitted with a flash memory device 1210 according to the inventive concept. The memory card 1200 includes a memory controller 1220 controlling all data exchanges between a host and the flash memory device 1210.

A static random access memory (SRAM) 1221 is used as an operation memory of a central processing unit (CPU) 1222. A host interface (I/F) 1223 includes a data exchange protocol of a host connected to the memory card 1200. An error correction code (ECC) block 1224 detects and corrects an error included in data read from the flash memory device 1210 having a multi-bit characteristic. A memory interface 1225 interfaces with the flash memory device 1210 including the semiconductor device of the inventive concept. The central processing unit (CPU) 1222 performs all control operations for data exchange of the memory controller 1220. Although not illustrated in the drawings, the memory card 1200 may further include a read only memory (ROM) for storing code data for interfacing with the host.

According to the memory device, memory card or memory system of the present inventive concepts, a highly integrated memory system may be provided. In particular, a flash memory device of the present inventive concepts may be provided to a memory system such as a solid state driver (SSD). In this case, the highly integrated memory system may be realized.

Semiconductor devices according to embodiments of the inventive concepts may include the interlayer insulating structure including the air gap defined by the substrate, the spacers respectively disposed on both sidewalls of each of wires, and the capping pattern disposed between upper portions of the spacers. According to this structure of the interlayer insulating structure, it is possible to prevent the wire from collapsing. Thus, methods of fabricating semiconductor devices having high reliability may be provided.

Also, semiconductor devices according to embodiments of the inventive concepts may include the interlayer insulating structure including the air gap defined by the substrate, the spacers respectively positioned at sidewalls of each of wires, and the capping pattern disposed between upper portions of the spacers. According to this structure of the interlayer insulating structure, it is possible to reduce problems associated with RC delay. Thus, methods of fabricating semiconductor devices optimized for high integrity may be provided.

Figure 11:
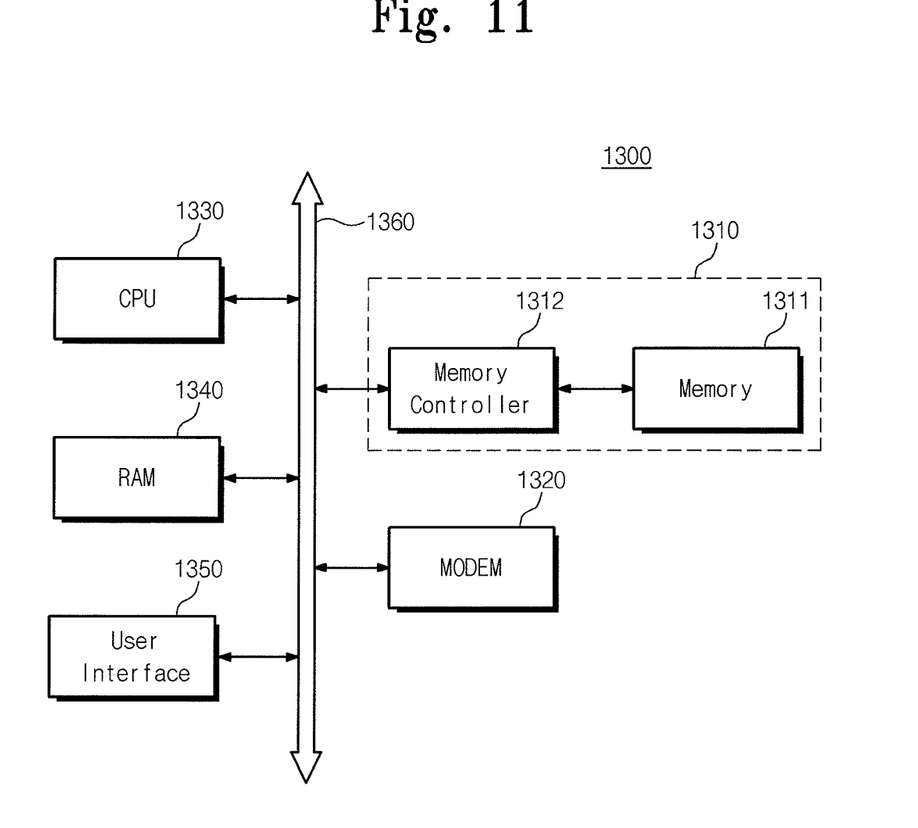
FIG. 11 is a schematic block diagram illustrating an example of a data processing system including the semiconductor device according to the embodiments of the inventive concepts.

FIG. 11 is a schematic block diagram illustrating an example of a data processing system including the semiconductor device according to the embodiments of the inventive concept.

Referring to FIG. 11, a memory system 1310 including the semiconductor device 1311 and a memory controller 1312 that controls overall data exchange between the semiconductor device 1311 and the system bus 1360 may be built in a data processing system such as mobile devices and desktop computers. The data processing system 1300 according to the inventive concept includes the flash memory system 1310, a modem 1320, a central processing unit 1330, RAM 1340, and a user interface 1350 that are electrically connected to a system bus 1360. The memory system 1310 may have substantially the same constitution as the memory system described in FIG. 9. The flash memory system 1310 stores data processed by the central processing unit 1330 or data received from the outside. For example, the memory system 1310 may be constituted by the SSD. In this case, the data processing system 1300 may stably and reliably store large-capacity data in the memory system 1310. As reliability increases, the flash memory system 1310 can reduce resources required in an error correction, thereby providing a data exchange function of high speed to the data processing system 1300. Although not illustrated in the drawings, the data processing system 1300 may further include an application chipset, an image signal processor (ISP), an input/output device or the like.

The flash memory device or the memory system according to the inventive concept may be mounted by various types of packages. The flash memory device or the memory system in accordance with the inventive concept may be mounted by various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP) and wafer-level processed stack package (WSP).

The above-disclosed subject matter is to be considered illustrative, and not restrictive, and the appended claims are intended to cover all such modifications, enhancements, and other embodiments, which fall within the true spirit and scope of the present inventive concepts. Thus, to the maximum extent allowed by law, the scope of the present inventive concepts is to be determined by the broadest permissible interpretation of the following claims and their equivalents, and shall not be restricted or limited by the foregoing detailed description.

What is claimed is:

1. A method of fabricating a semiconductor device, the method comprising;
   successively providing a first sacrificial layer, a first insulating layer, and a second sacrificial layer on a substrate;
   patterning the second sacrificial layer, the first insulating layer, and the first sacrificial layer to define an opening exposing a portion of the substrate and successively forming second sacrificial patterns, capping patterns, and first sacrificial patterns on the substrate;
   conformally forming a second insulating layer at inner sidewalls and a bottom of the opening;
   etching the second insulating layer and the second sacrificial patterns to form spacers on sidewalls of the first sacrificial patterns and to remove the second sacrificial patterns;
   forming a wiring pattern to fill the opening in which the spacers are formed; and
   vaporizing the first sacrificial patterns.

2. The method of claim 1, wherein the first sacrificial layer comprises a hydrocarbon-based material.

3. The method of claim 1, wherein the first insulating layer comprises a porous material.

4. The method of claim 1, wherein the second sacrificial layer and the second insulating layer comprise the same material.

5. The method of claim 4, wherein the second sacrificial layer and the second insulating layer each comprise silicon carbon nitride.

6. The method of claim 1, wherein the vaporizing of the first sacrificial patterns comprises vaporizing using heat energy or optical energy.

7. The method of claim 1, wherein the forming of the wiring pattern comprises:
   forming a wiring layer to further cover the opening in which the spacers are formed; and
   planarizing the wiring layer until the capping patterns are exposed.

8. The method of claim 7, wherein the wiring layer comprises tungsten or copper.

9. The method of claim 7, further comprising forming a barrier layer along the inner sidewalls and the bottom of the opening in which the spacers are formed prior to forming the wiring layer.

10. The method of claim 9, wherein the wiring layer comprises tungsten, and wherein the barrier layer comprises a metal barrier layer.

11. The method of claim 10, wherein the metal barrier layer comprises at least one selected from tantalum (Ta), tantalum nitride (TaN), ruthenium (Ru), cobalt (Co), manganese (Mn), titanium (Ti), titanium nitride (TiN), tungsten nitride (WN), nickel (Ni), nickel boride (NiB), and combinations thereof.

12. The method of claim 9, wherein the wiring layer comprises copper, and wherein the barrier layer comprises a dual layer in turn comprising a metal barrier layer and a seed layer on the metal barrier layer.

13. A method of fabricating a semiconductor device comprising:
- successively providing a first sacrificial layer, a first insulating layer, and a second sacrificial layer on a substrate;
- patterning the second sacrificial layer, the first insulating layer, and the first sacrificial layer to define openings exposing a portion of the substrate and thereby forming second sacrificial patterns, capping patterns, and first sacrificial patterns on the substrate between neighboring ones of the openings;
- conformally forming a second insulating layer at inner sidewalls and a bottoms of the openings;
- etching the second insulating layer and the second sacrificial patterns to form spacers on sidewalls of the first sacrificial patterns in the openings;
- providing a conductive material in the openings; and
- vaporizing the first sacrificial patterns to form air gaps between the neighboring ones of the openings.

14. The method of claim 13 wherein vaporizing the first sacrificial patterns comprises forming the air gaps between the spacers in a horizontal direction of the substrate and between the substrate and the first insulating layer in a vertical direction of the substrate.

15. The method of claim 14 further comprising:
- providing an etch stop layer on the substrate prior to providing the first insulating layer;
- wherein forming the air gaps further comprises forming the air gaps between the etch stop layer and the first insulating layer in the vertical direction of the substrate.

16. The method of claim 13 wherein providing the first insulating material comprises providing a porous material.

17. The method of claim 16 wherein vaporizing the first sacrificial patterns comprises vaporizing the first sacrificial patterns through pores in the porous material.

* * * * *